(12) United States Patent
Tsukamoto et al.

(10) Patent No.: US 11,411,545 B2
(45) Date of Patent: Aug. 9, 2022

(54) MULTIPLEXER, AND RADIO FREQUENCY FRONT-END CIRCUIT AND COMMUNICATION DEVICE THAT USE THE SAME

(71) Applicant: Murata Manufacturing Co., Ltd., Kyoto (JP)

(72) Inventors: Hideki Tsukamoto, Kyoto (JP); Hirotsugu Mori, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 17/197,261

(22) Filed: Mar. 10, 2021

(65) Prior Publication Data

US 2021/0194452 A1 Jun. 24, 2021

Related U.S. Application Data

(63) Continuation of application No. PCT/JP2019/031344, filed on Aug. 8, 2019.

(30) Foreign Application Priority Data

Sep. 13, 2018 (JP) .............................. JP2018-171434

(51) Int. Cl.
*H03H 7/48* (2006.01)
*H03F 3/19* (2006.01)
(Continued)

(52) U.S. Cl.
CPC ................. *H03H 7/48* (2013.01); *H03F 3/19* (2013.01); *H03H 7/0115* (2013.01); *H04B 1/40* (2013.01); *H03F 2200/451* (2013.01)

(58) Field of Classification Search
CPC .......... H03H 7/48; H03H 7/0115; H03F 3/19; H03F 2200/451; H04B 1/40
See application file for complete search history.

(56) References Cited

U.S. PATENT DOCUMENTS

2008/0037590 A1* 2/2008 Aiga .................... H04B 1/0057
370/497
2012/0081192 A1 4/2012 Hanaoka
(Continued)

FOREIGN PATENT DOCUMENTS

JP 2012-080246 A 4/2012
JP 2013-243600 A 12/2013
(Continued)

OTHER PUBLICATIONS

International Search Report for International Patent Application No. PCT/JP2019/031344 dated Oct. 1, 2019.

(Continued)

*Primary Examiner* — Nguyen T Vo
(74) *Attorney, Agent, or Firm* — Pearne & Gordon LLP

(57) ABSTRACT

A multiplexer (100) includes a first filter (FLT1) that passes a signal in a first frequency band, a second filter (FLT2) that passes a signal in a second frequency band lower than the first frequency band, and a third filter (FLT3) that passes a signal in a third frequency band. The third frequency band is a frequency band higher than the first frequency band, or a frequency band lower than the second frequency band. The first filter includes a first inductor (L11) that forms a first attenuation pole on a low-frequency side of the first frequency band. The second filter includes a second inductor (L23) that forms a second attenuation pole on a high-frequency side of the second frequency band. At least a portion of a component constituting the third filter is disposed between the first inductor and the second inductor.

20 Claims, 8 Drawing Sheets

(51) Int. Cl.
*H03H 7/01* (2006.01)
*H04B 1/40* (2015.01)

(56) References Cited

U.S. PATENT DOCUMENTS

| | | | | |
|---|---|---|---|---|
| 2013/0229242 A1* | 9/2013 | Takata | ............... | H03H 9/6483 |
| | | | | 333/193 |
| 2013/0309984 A1* | 11/2013 | Uejima | ............... | H04B 1/525 |
| | | | | 455/114.1 |
| 2017/0194939 A1 | 7/2017 | Mukai | | |
| 2019/0081613 A1 | 3/2019 | Nosaka | | |
| 2020/0067490 A1* | 2/2020 | Kuwahara | ............. | H03H 9/725 |

FOREIGN PATENT DOCUMENTS

| | | |
|---|---|---|
| WO | 2016/056377 A1 | 4/2016 |
| WO | 2017/204346 A1 | 11/2017 |

OTHER PUBLICATIONS

Written Opinion for International Patent Application No. PCT/JP2019/031344 dated Oct. 1, 2019.

\* cited by examiner

MULTIPLEXER, AND RADIO FREQUENCY FRONT-END CIRCUIT AND COMMUNICATION DEVICE THAT USE THE SAME

CROSS REFERENCE TO RELATED APPLICATIONS

This is a continuation of International Application No. PCT/JP2019/031344 filed on Aug. 8, 2019 which claims priority from Japanese Patent Application No. 2018-171434 filed on Sep. 13, 2018. The contents of these applications are incorporated herein by reference in their entireties.

BACKGROUND OF THE DISCLOSURE

Field of the Disclosure

The present disclosure relates to a multiplexer, and a radio frequency front-end circuit and a communication device that use the multiplexer (Hereinafter, they are also referred to as a multiplexer and so forth.) and, more specifically, to a configuration that improves electrical characteristics of the multiplexer and so forth.

Description of the Related Art

In recent years, in mobile terminals, such as mobile phones or smartphones, multiband communications are being promoted in which communications are performed by using radio waves in a plurality of frequency bands. In such mobile terminals, a multiplexer for separating radio frequency signals transmitted and received by using one antenna into signals in a plurality of frequency bands is incorporated.

Japanese Unexamined Patent Application Publication No. 2013-243600 (Patent Document 1) discloses a triplexer for separating an input signal into three different frequency bands. In the triplexer disclosed in Japanese Unexamined Patent Application Publication No. 2013-243600 (Patent Document 1), a first filter is directly connected to an input port, and a second filter and a third filter are connected to the input port via a common matching capacitor. This configuration achieves isolation performance in each frequency band, low insertion loss, and a reduction in height in a relatively simple configuration.

Patent Document 1: Japanese Unexamined Patent Application Publication No. 2013-243600

BRIEF SUMMARY OF THE DISCLOSURE

In the multiplexer, isolation characteristics between filters has to be improved so that signals in different frequency bands may be passed by the respective filters. In particular, in the case where frequency bands of signals passed by two respective filters are adjacent to each other, that is, in the case where two filters whose pass bands are adjacent to each other are used, it is important to provide sharp attenuation around a boundary between the frequency bands.

Typically, in filters used in the multiplexer, an inductor is used to form an attenuation pole in some cases. When, between two filters that pass signals in respective frequency bands adjacent to each other, inductors that form attenuation poles couple to each other via a magnetic field, sufficient attenuation is not obtained due to signal leakage caused by the magnetic field coupling, resulting in the possibility that isolation characteristics between the filters may deteriorate.

The present disclosure has been made to solve such an issue and aims to, in a multiplexer, improve isolation characteristics between filters that pass signals in respective frequency bands adjacent to each other.

A multiplexer according to the present disclosure includes a first filter configured to pass a signal in a first frequency band, a second filter configured to pass a signal in a second frequency band lower than the first frequency band, and a third filter configured to pass a signal in a third frequency band. The third frequency band is a frequency band higher than the first frequency band, or a frequency band lower than the second frequency band. The first filter includes a first inductor configured to form a first attenuation pole on a low-frequency side of the first frequency band. The second filter includes a second inductor configured to form a second attenuation pole on a high-frequency side of the second frequency band. At least a portion of a component constituting the third filter is disposed between the first inductor and the second inductor.

In the multiplexer according to the present disclosure, in two filters (the first filter, the second filter) that pass signals in respective frequency bands adjacent to each other, between inductors that form attenuation poles on adjacent sides of two frequency bands, a component of another filter (third filter) is disposed. This can reduce the degree of magnetic field coupling between the inductors that form attenuation poles, therefore enabling an improvement in isolation characteristics between the first filter and the second filter.

DETAILED DESCRIPTION OF THE DISCLOSURE

Figure 1:
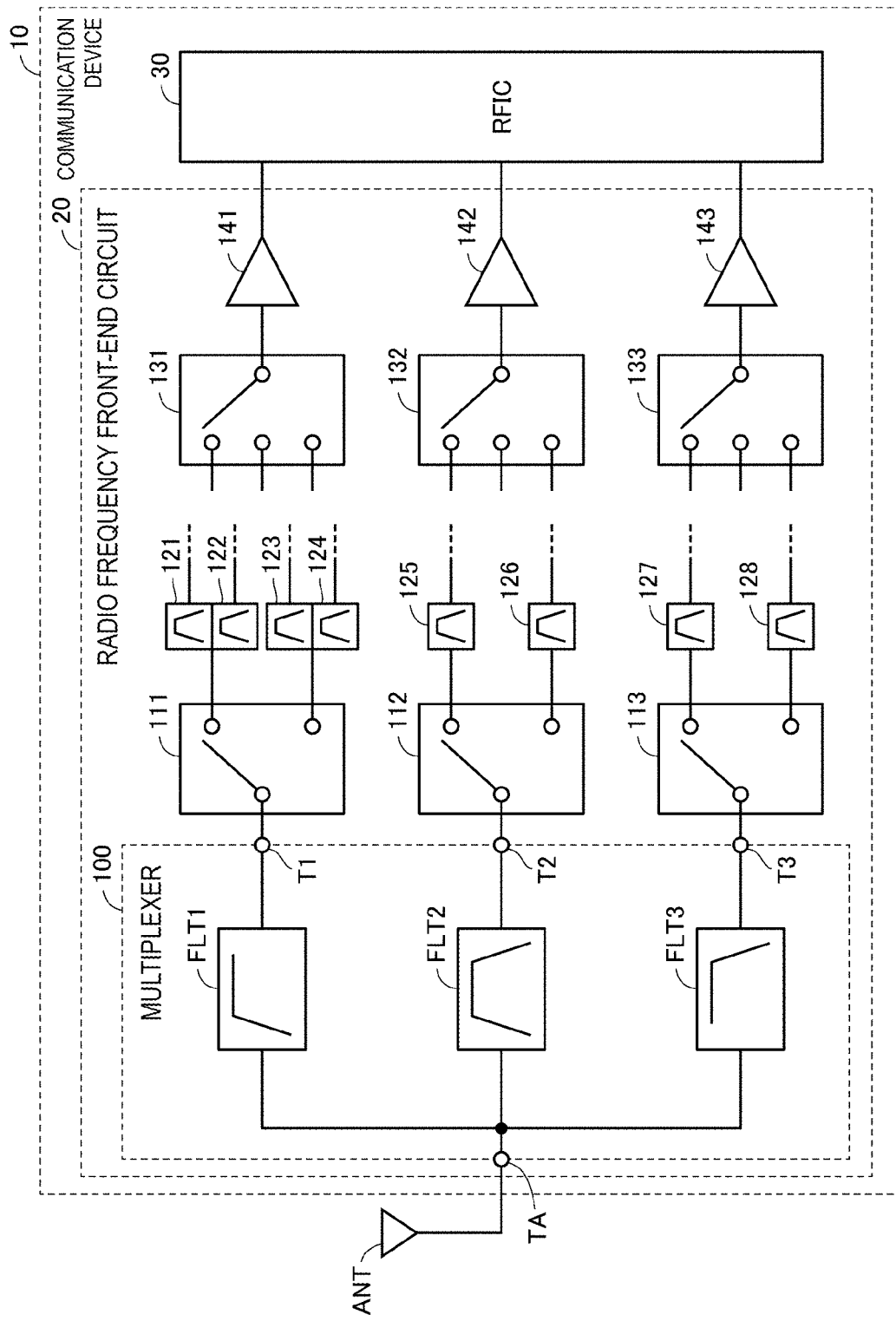
FIG. 1 is a block diagram of a communication device in which a multiplexer according to an embodiment is used.

An embodiment of the present disclosure will be described in detail below with reference to the drawings. Note that identical or corresponding elements or portions in the drawings are denoted by the same reference signs and a repeated description thereof is not given.

(Entire Configuration of Communication Device)

FIG. 1 is a block diagram of a communication device 10 in which a multiplexer 100 according to the embodiment is used. The communication device 10 is, for example, a mobile terminal, such as a mobile phone, smartphone, or tablet, or a personal computer having a communication function.

Referring to FIG. 1, the communication device 10 includes a radio frequency front-end circuit 20, and an RF signal processing circuit (Hereinafter, it is also referred to as "RFIC".) 30. The radio frequency front-end circuit 20 is a circuit for transmitting a radio frequency signal between an antenna device ANT and the RFIC 30. Specifically, the radio frequency front-end circuit 20 separates a radio frequency signal received by the antenna device ANT into a plurality of predetermined frequency bands and transmits the separated radio frequency signals to the RFIC 30.

The radio frequency front-end circuit 20 includes the multiplexer 100, switches 111 to 113 and 131 to 133, amplifier circuits 141 to 143, and band pass filters (Hereinafter, they are also referred to as "BPFs".) 121 to 128. Incidentally, the BPFs 121 and 122 constitute a duplexer, and the BPFs 123 and 124 constitute a duplexer.

The multiplexer 100 is a triplexer including a filter FLT1, a filter FLT2, and a filter FLT3 that have, as a pass band, respective frequency ranges different from one another.

The filter FLT1 is connected between an antenna terminal TA and a terminal T1 (first terminal). The filter FLT1 is a high pass filter (Hereinafter, it is also referred to as "HPF".) in which a frequency range of a high band group is a pass band and in which frequency ranges of a middle band group and a low band group are attenuation bands.

The filter FLT2 is connected between the antenna terminal TA and a terminal T2 (second terminal). The filter FLT2 is a band pass filter in which a frequency range of the middle band group is a pass band and in which frequency ranges of the high band group and the low band group are attenuation bands.

The filter FLT3 is connected between the antenna terminal TA and a terminal T3 (third terminal). The filter FLT3 is a low pass filter (Hereinafter, it is also referred to as "LPF".) in which a frequency range of the low band group is a pass band and in which frequency ranges of the high band group and the middle band group are attenuation bands.

Incidentally, the high pass filter of the filter FLT1 and the low pass filter of the filter FLT3 may be changed to a band pass filter.

As an example, frequency bands of signals passed by the respective filters of the multiplexer 100 according to the present embodiment correspond to any three frequency bands of five frequency bands of greater than or equal to 1427 MHz and less than 2690 MHz, greater than or equal to 3300 MHz and less than 4200 MHz, greater than or equal to 4400 MHz and less than 5000 MHz, greater than or equal to 5150 MHz and less than 6000 MHz, and greater than or equal to 5925 MHz and less than 7125 MHz. Alternatively, as another example, the frequency bands correspond to any three frequency bands among six frequency bands of greater than or equal to 699 MHz and less than 960 MHz, greater than or equal to 1427 MHz and less than 2200 MHz, greater than or equal to 2300 MHz and less than 2690 MHz, greater than or equal to 3300 MHz and less than 5000 MHz, greater than or equal to 5150 MHz and less than 6000 MHz, and greater than or equal to 5925 MHz and less than 7125 MHz. Incidentally, a filter having a frequency band other than those above may be used.

Each of the filters FLT1 to FLT3 passes, of a radio frequency signal received by the antenna device ANT, only a radio frequency signal corresponding to a pass band of the filter. Thus, a reception signal from the antenna device ANT is separated into signals in a plurality of predetermined frequency bands.

The switches 111 to 113 are connected between the multiplexer 100 and the BPFs 121 to 128, and connect signal paths corresponding to the respective low band, middle band, and high band groups and the BPFs 121 to 128 in accordance with a control signal from a control unit (not illustrated).

Specifically, in the switch 111, a common terminal is connected to the filter FLT1, and selection terminals are connected to the BPFs 121 to 124. In the switch 112, a common terminal is connected to the filter FLT2, and selection terminals are connected to the BPFs 125 and 126. In the switch 113, a common terminal is connected to the filter FLT3, and selection terminals are connected to the BPFs 127 and 128.

The switches 131 to 133 are connected between the amplifier circuits 141 to 143 and the BPFs 121 to 128, and connect the BPFs 121 to 128 and the amplifier circuits 141 to 143 in accordance with a control signal from the control unit (not illustrated).

Specifically, in the switch 131, a common terminal is connected to the amplifier circuit 141, and selection terminals are connected to the BPFs 121 to 124. In the switch 132, a common terminal is connected to the amplifier circuit 142, and selection terminals are connected to the BPFs 125 and 126. In the switch 133, a common terminal is connected to the amplifier circuit 143, and selection terminals are connected to the BPFs 127 and 128.

In the case of the radio frequency front-end circuit 20 illustrated in FIG. 1, a frequency band of a signal passed by the filter FLT1 includes pass bands of the respective BPFs 121 to 124. Furthermore, a frequency band of a signal passed by the filter FLT2 includes pass bands of the respective BPFs 125 and 126, and a frequency band of a signal passed by the filter FLT3 includes pass bands of the respective BPFs 127 and 128. Incidentally, when a frequency band of a signal passed by each filter does not include a plurality of pass bands, the switches 111 to 113 and 131 to 133, and the BPFs 121 to 128 are not provided in some cases.

The RFIC 30 is an RF signal processing circuit that processes radio frequency signals transmitted and received by the antenna device ANT. Specifically, the RFIC 30 performs, through down-conversion or the like, signal processing on a radio frequency signal inputted from the antenna device ANT through a reception-side signal path of the radio frequency front-end circuit 20 and outputs a reception signal generated through the signal processing to a baseband signal processing circuit (not illustrated).

Incidentally, although FIG. 1 illustrates only reception-side signal paths of the radio frequency front-end circuit 20, the radio frequency front-end circuit 20 may include transmission-side signal paths. In this case, a radio frequency signal outputted from the RFIC 30 is transmitted to the antenna device ANT through a transmission-side signal path of the radio frequency front-end circuit 20 and is emitted from the antenna device ANT. The RFIC 30 performs, through up-conversion or the like, signal processing on a transmission signal inputted from the baseband signal processing circuit and outputs a radio frequency signal generated through the signal processing to a transmission-side signal path of the radio frequency front-end circuit 20. In the transmission-side signal paths, the amplifier circuits 141 to 143 serve as power amplifiers that amplify power of radio frequency transmission signals outputted from the RFIC 30.

(Configuration of Multiplexer)

Figure 2:
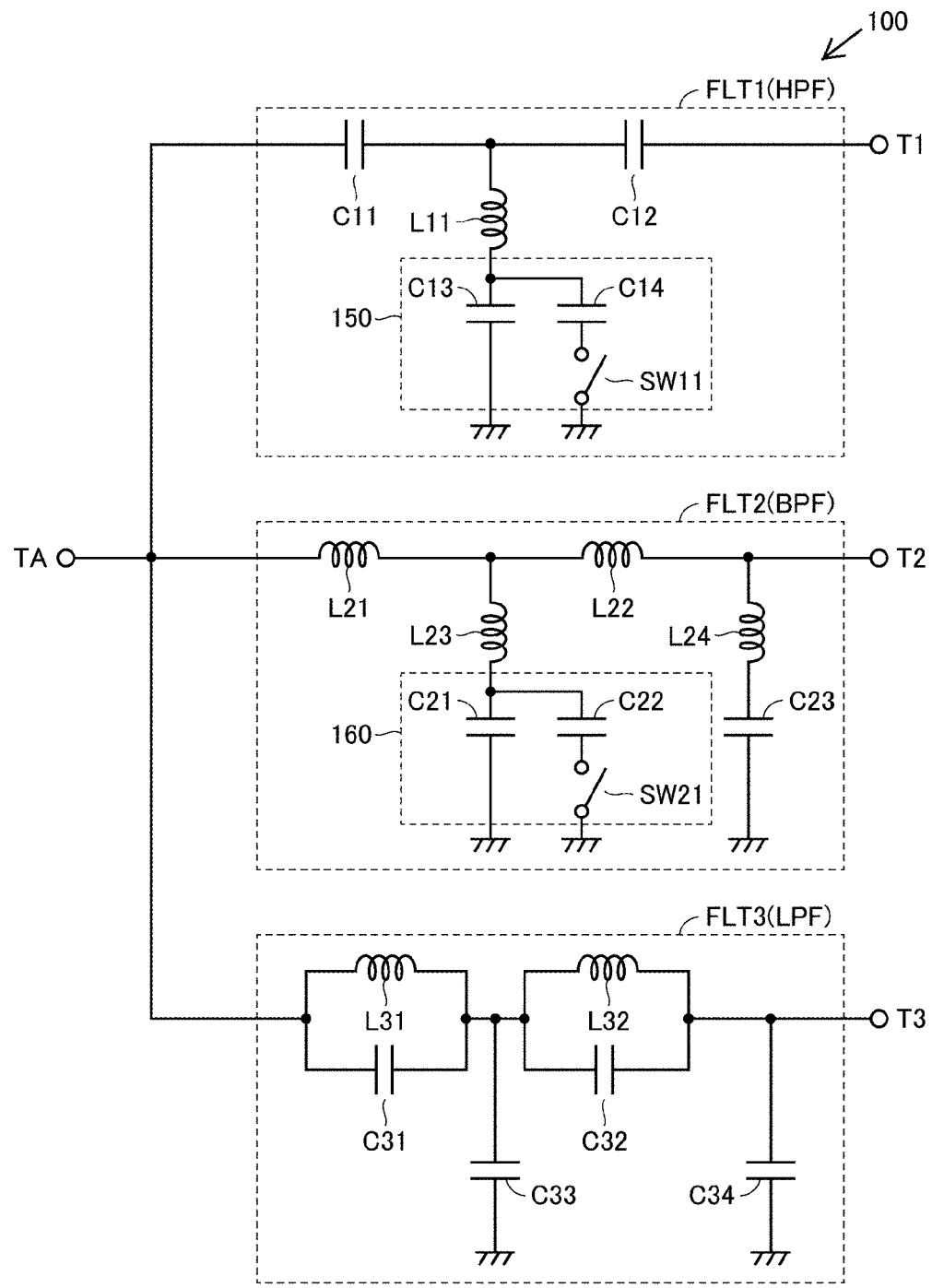
FIG. 2 illustrates a detailed circuit configuration of the multiplexer illustrated in FIG. 1.

FIG. 2 illustrates a detailed circuit configuration of the multiplexer 100 illustrated in FIG. 1. As described with reference to FIG. 1, the filter FLT1 is connected between the antenna terminal TA and the terminal T1. The filter FLT2 is connected between the antenna terminal TA and the terminal T2, and the filter FLT3 is connected between the antenna terminal TA and the terminal T3.

The filter FLT1 includes capacitors C11 and C12 that form a series arm circuit, and capacitors C13 and C14, an inductor L11, and a switch SW11 that form a parallel arm circuit. The capacitors C11 and C12 are connected in series between the antenna terminal TA and the terminal T1. One end of the inductor L11 is connected to a connection node between the capacitor C11 and the capacitor C12. The capacitor C13 is connected between the other end of the inductor L11 and a ground potential. Furthermore, one end of the capacitor C14 is further connected to the other end of the inductor L11, and the other end of the capacitor C14 is connected to the ground potential via the switch SW11.

The switch SW11 is switched between conduction and non-conduction in accordance with a control signal from the control unit, which is not illustrated. The impedance of the parallel arm circuit is switched by switching the switch SW11, thereby making it possible to adjust a frequency of an attenuation pole formed by the parallel arm circuit. In other words, the filter FLT1 is a tunable filter. Incidentally, the capacitors C13 and C14, and the switch SW11 form a variable impedance circuit 150.

The filter FLT2 includes inductors L21 and L22 that form a series arm circuit, and inductors L23 and L24, capacitors C21 to C23, and a switch SW21 that form a parallel arm circuit. The inductors L21 and L22 are connected in series between the antenna terminal TA and the terminal T2. One end of the inductor L23 is connected to a connection node between the inductor L21 and the inductor L22. The capacitor C21 is connected between the other end of the inductor L23 and the ground potential. Furthermore, one end of the capacitor C22 is further connected to the other end of the inductor L23, and the other end of the capacitor C22 is connected to the ground potential via the switch SW21. One end of the inductor L24 is connected to the terminal T2, and the capacitor C23 is connected between the other end of the inductor L24 and the ground potential.

With respect to the filter FLT2 as well, the impedance of the parallel arm circuit is switched by switching the switch SW21, thereby making it possible to adjust a frequency of an attenuation pole formed by the parallel arm circuit. In other words, the filter FLT2 is also a tunable filter. Incidentally, the capacitors C21 and C22, and the switch SW21 form a variable impedance circuit 160.

In the filter FLT2, a frequency band between an attenuation pole formed by the parallel arm circuit including the inductor L23 and an attenuation pole formed by the parallel arm circuit including the inductor L24 is a pass band of the band pass filter. In an example of the present embodiment, the parallel arm circuit including the inductor L23 forms a high-frequency-side attenuation pole, and the parallel arm circuit including the inductor L24 forms a low-frequency-side attenuation pole.

The filter FLT3 includes inductors L31 and L32 and capacitors C31 and C32 that form a series arm circuit, and capacitors C33 and C34 that form a parallel arm circuit. The inductors L31 and L32 are connected in series between the antenna terminal TA and the terminal T3. Furthermore, the capacitor C31 is connected in parallel with the inductor L31, and the capacitor C32 is connected in parallel with the inductor L32. In other words, a parallel circuit formed by the inductor L31 and the capacitor C31 and a parallel circuit formed by the inductor L32 and the capacitor C32 are connected in series between the antenna terminal TA and the terminal T3.

The capacitor C33 is connected between a connection node between the inductor L31 and the inductor L32 and the ground potential. The capacitor C34 is connected between the terminal T3 and the ground potential.

In a multiplexer, such as the above-described multiplexer, including a plurality of filters that pass signals in respective frequency bands different from one another, signal leakage between filters has to be reduced to improve the quality of communication. To achieve the reduction in signal leakage, isolation characteristics between filters has to be improved. On the other hand, in each filter, it is desirable to reduce pass loss (to achieve a wider band) in a set frequency band as much as possible. For that reason, in particular, in the case where two frequency bands of signals passed are adjacent to each other, it is important to increase the sharpness of attenuation at end portions of the two frequency bands around a boundary between the two frequency bands.

As described with reference to FIG. 2, in each filter used in the multiplexer, an inductor is typically used to form an attenuation pole. When, between two filters that pass signals in respective frequency bands adjacent to each other, inductors that form attenuation poles couple to each other via a magnetic field, sufficient attenuation is not obtained due to signal leakage caused by the magnetic field coupling, resulting in the possibility that isolation characteristics between the filters may deteriorate.

Thus, in the present embodiment, with respect to two filters that pass signals in respective frequency bands adjacent to each other in the multiplexer, a layout is employed in which, between inductors that form attenuation poles on adjacent sides of two frequency bands, or more specifically, within a region with an outer edge partially constituted by the two inductors, a component of another filter other than the two filters is included. Such a layout can cause the component of the other filter to weaken the magnetic field coupling between the inductors that form attenuation poles, therefore enabling an improvement in isolation characteristics between the filters that pass signals in the respective frequency bands adjacent to each other.

Figure 3:
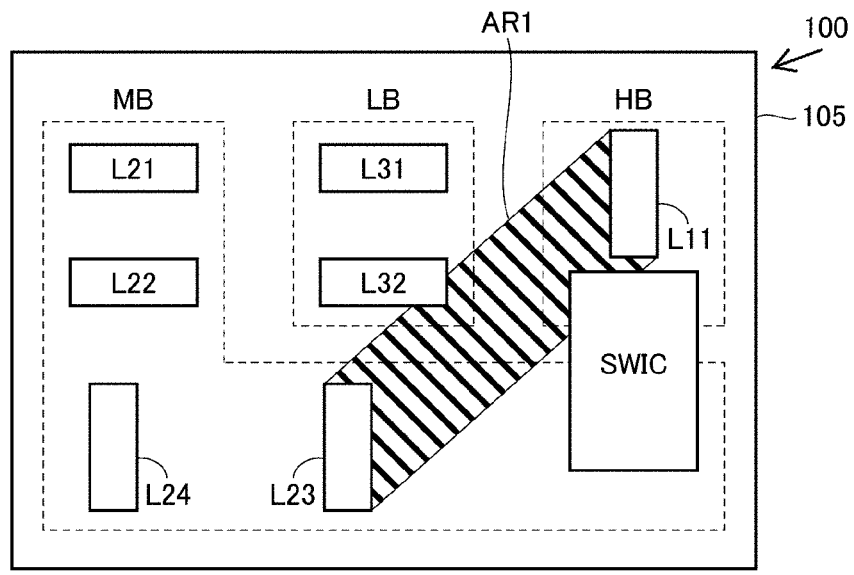
FIG. 3 is a schematic layout diagram of elements mounted on a substrate where the multiplexer is formed.

FIG. 3 is a schematic layout diagram of elements mounted on a substrate 105 where the multiplexer 100 illustrated in FIG. 2 is formed. In the multiplexer 100 according to the present embodiment, in the substrate 105 having a multilayer structure, conductor electrodes constituting the capacitors C11 to C14, C21 to C23, and C31 to C34 included in the filters, and wiring patterns connecting elements are formed. Furthermore, the inductors L11, L21 to L24, L31, and L32 included in the filters, and a switch circuit SWIC are mounted on the substrate 105 as chip components. Incidentally, the switch circuit SWIC is a circuit obtained as an integrated circuit by forming, in the same element, the switch SW11 included in the filter FLT1 and the switch SW21 included in the filter FLT2.

Referring to FIG. 3, in an example of FIG. 3, elements related to the middle-band filter FLT2 in which the number of chip components is large are disposed within a dashed-line region MB of a substantially L shape. Elements related to the high-band filter FLT1 and elements related to the low-band filter FLT3 are respectively disposed within a dashed-line region HB and a dashed-line region LB that are of a rectangular shape. Incidentally, the switch circuit SWIC includes the switches SW11 and SW21 of the filter FLT1 and the filter FLT2 as described above, and thus the switch circuit SWIC is disposed so as to straddle both the dashed-line regions HB and MB.

Then, in the filter FLT1 and the filter FLT2, between the inductor L11 and the inductor L23 that form adjacent attenuation poles, in other words, within a region AR1 (a hatched portion in FIG. 3) with an outer edge partially constituted by the inductor L11 and the inductor L23, at least a portion of a component (inductor L32 herein) included in the filter FLT3 is disposed.

Such a layout causes the inductor L32 of the filter FLT3 to block at least a portion of a magnetic field generated by the inductor L11 and at least a portion of a magnetic field generated by the inductor L23, resulting in the weakening of direct magnetic field coupling between the inductor L11 and the inductor L23. Hence, a reduction in attenuation at an attenuation pole caused by the magnetic field coupling between the inductor L11 and the inductor L23 can be inhibited, and isolation characteristics between the filter FLT1 and the filter FLT2 can be kept from deteriorating.

Incidentally, in the case where intended attenuation characteristics are achieved by using a plurality of attenuation poles at end portions on a high-frequency side and a low-frequency side of a frequency band of a signal passed by (a pass band of) each filter, it is desirable to inhibit magnetic field coupling caused by an inductor that forms an attenuation pole closest to the set pass band. In other words, in the high-frequency band-side filter FLT1, of attenuation poles formed on a low-frequency side of the pass band of the filter FLT1, an inductor that forms an attenuation pole closest to the pass band of the filter FLT1 is a subject. Also, in the low-frequency band-side filter FLT2, of attenuation poles formed on a high-frequency side of its pass band, an inductor that forms an attenuation pole closest to the pass band of the filter FLT2 is a subject.

In the example of FIG. 3, for example, in the case where a configuration is considered in which positions of the inductor L23 and the inductor L24 in the filter FLT2 are reversed, a distance between the inductor L11 and the inductor L23 is increased, and the portion of the inductor L32 included between the inductor L11 and the inductor L23 (that is, within the region with the outer edge partially constituted by the inductor L11 and the inductor L23) becomes larger in area, thus making it possible to further weakening the magnetic field coupling between the inductor L11 and the inductor L23. On the other hand, in the present embodiment, the inductor L23 and the switch SW21 have to be connected to each other, and, when a distance between the inductor L23 and the switch circuit SWIC is increased, a wiring pattern connecting the inductor L23 and the switch SW21 is lengthened, and there is concern about an increase in wire loss.

For that reason, it is desirable that the inductor L11 and the inductor L23 that share the switch circuit SWIC are disposed adjacent to the switch circuit SWIC. In this case, the inductor L11 and the inductor L23 are more likely to couple to each other via a magnetic field. Hence, as illustrated in FIG. 3, when a layout is provided such that at least a portion of the inductor L32 included in the filter FLT3 is within the region AR1 while the inductor L23 is disposed adjacent to the switch circuit SWIC, the magnetic field coupling between the inductor L11 and the inductor L23 can be weakened without an increase in wire loss.

Incidentally, to weaken the magnetic field coupling between the inductor L11 and the inductor L23, a layout may be provided such that a component, such as the switch circuit SWIC illustrated in FIG. 3, other than a component included in the filter FLT3 is further included in the region AR1.

Figure 4:
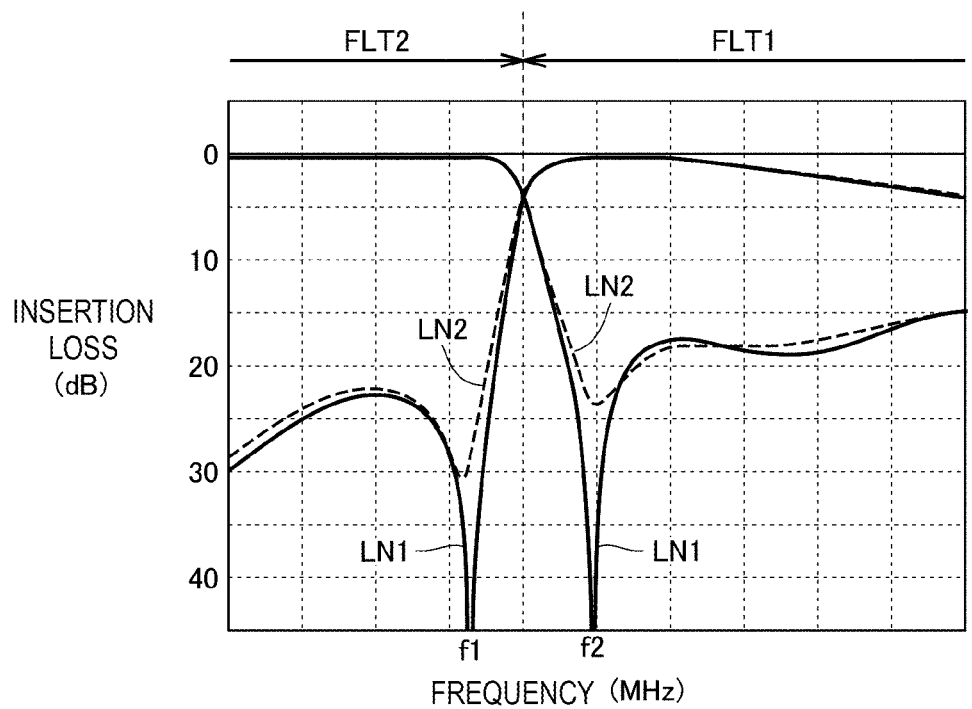
FIG. 4 illustrates attenuation characteristics in the embodiment and a comparative example.

FIG. 4 illustrates attenuation characteristics of adjacent pass bands of the filter FLT1 and the filter FLT2 in the embodiment and a comparative example. In FIG. 4, the horizontal axis represents frequency, and the vertical axis represents insertion loss of each filter. Furthermore, in FIG. 4, a solid line LN1 represents attenuation characteristics in the present embodiment, and a dashed line LN2 represents attenuation characteristics in the comparative example.

Incidentally, a graph of the comparative example (dashed line LN2) represents attenuation characteristics in a configuration in which no other components are disposed within the region AR1 in FIG. 3 (that is, a configuration in which the inductor L11 and the inductor L23 directly couple to each other via a magnetic field).

As illustrated in FIG. 4, at both an attenuation pole (frequency f1) of the high band-side filter FLT1 and an attenuation pole (frequency f2) of the middle band-side filter FLT2, the insertion loss in the comparative example (dashed line LN2) is lower than the insertion loss in the present embodiment (solid line LN1), that is, it is seen that attenuation is lower. Furthermore, in the comparative example, the sharpness of a curve around each attenuation pole deteriorates with a decrease in insertion loss at the attenuation pole. In other words, when the magnetic field coupling between the inductor L11 and the inductor L23 is weakened by providing an element layout according to the present embodiment, the sharpness of attenuation is improved with an increase in insertion loss at each attenuation pole. Hence, in the present embodiment, isolation characteristics between two filters that pass signals in respective frequency bands adjacent to each other are improved.

Figure 5:
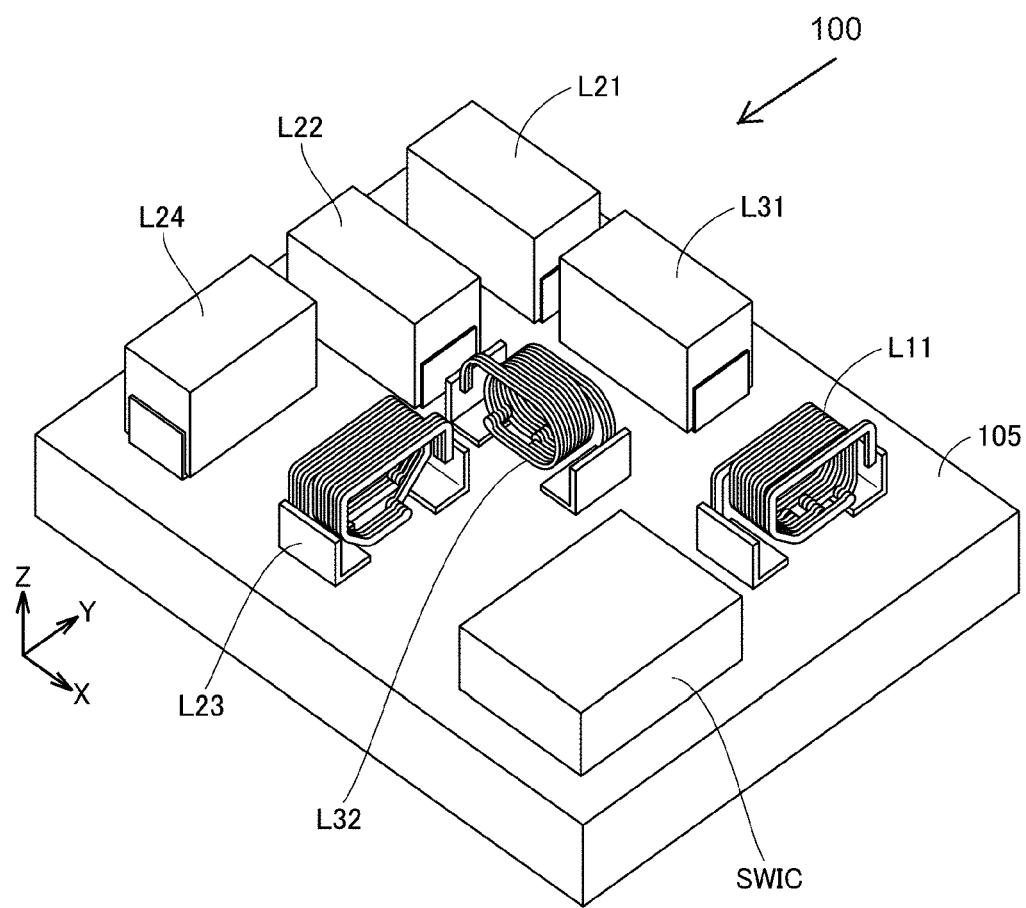
FIG. 5 illustrates a first example of a component layout of a third filter.
Figure 6:
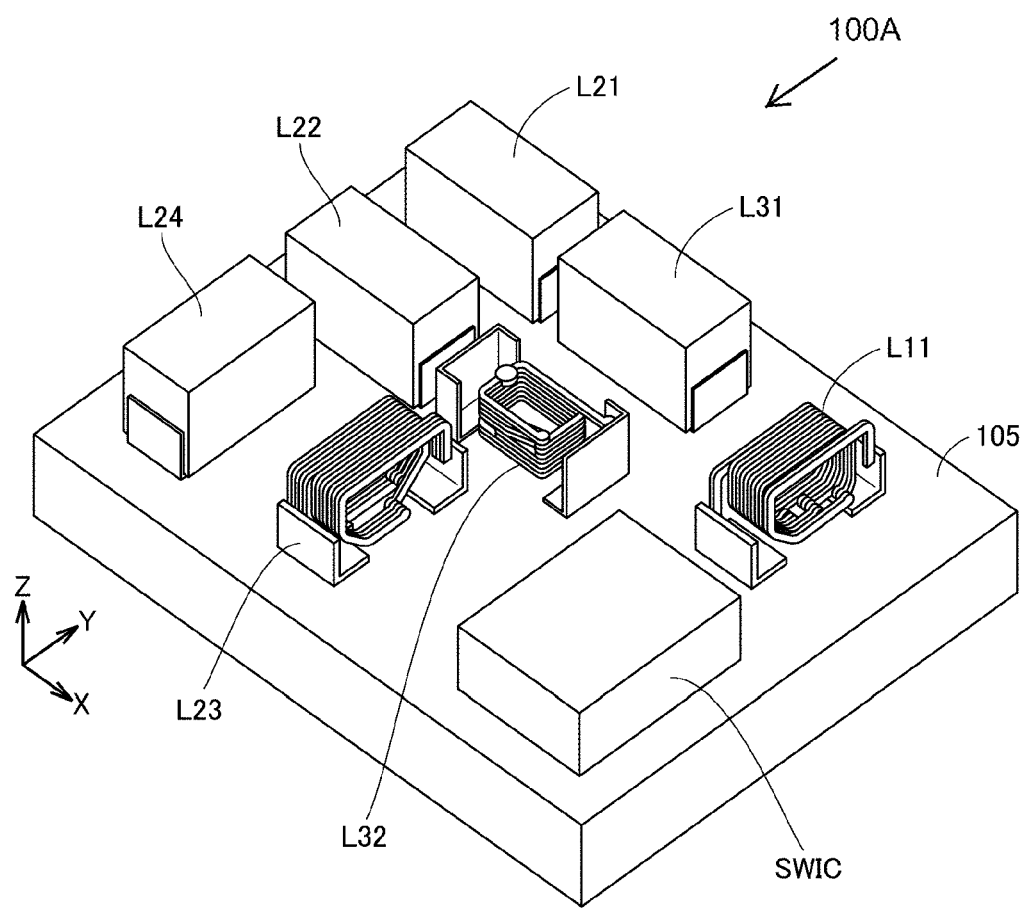
FIG. 6 illustrates a second example of the component layout of the third filter.

FIGS. 5 and 6 illustrate an example of the specific disposition of the inductor L32 of the low band-side filter FLT3 in the element layout illustrated in FIG. 3. Incidentally, FIGS. 5 and 6 illustrate a state in which cases of the inductors L11, L23, and L32 are removed so that directions in which coils are wound can be recognized.

First, referring to FIG. 5, in the case of the multiplexer 100 according to the present embodiment, the inductor L11 of the filter FLT1 and the inductor L23 of the filter FLT2 are disposed on the substrate 105 such that an X-axis direction in this figure is parallel to winding axes thereof. On the other hand, the inductor L32 of the filter FLT3 is disposed such that a Y-axis direction in this figure is parallel to a winding axis thereof.

Furthermore, in a multiplexer 100A illustrated in FIG. 6, although the inductor L11 and the inductor L23 are disposed such that an X-axis direction is parallel to winding axes thereof as in FIG. 5, the inductor L32 is disposed such that a Z-axis direction in this figure is parallel to a winding axis thereof.

If the winding axis of the inductor L32 is parallel to the winding axes of the inductor L11 and the inductor L23, the inductor L32 couples to the inductor L11 and the inductor L23 via a magnetic field. Then, the inductor L11 couples to the inductor L23 via a magnetic field through the inductor L32, resulting in the possibility of the deterioration in isolation characteristics.

On the other hand, when, as illustrated in FIGS. 5 and 6, a direction of the winding axis of the inductor L32 is orthogonal to the winding axes of the inductor L11 and the inductor L23, the inductor L32 does not couple to the inductor L11 and the inductor L23 via a magnetic field, therefore making it possible to keep the inductor L11 and the inductor L23 from coupling to each other via a magnetic field through the inductor L32.

Incidentally, although FIGS. 5 and 6 illustrate the example where the inductor L32 is disposed such that the direction of the winding axis of the inductor L32 is orthogonal to the winding axes of the inductor L11 and the inductor L23, the inductor L32 does not necessarily have to be disposed with the direction of the winding axis thereof being completely orthogonal to a direction of the winding axes of the inductor L11 and the inductor L23. When the directions of winding axes are orthogonal to each other as described above, the largest inhibiting effect on magnetic field coupling between the inductor L32 and the inductors L11 and L23 is produced, and thus such a configuration is more desirable. However, as long as the direction of the winding axis of the inductor L32 is not parallel to at least the direction of the winding axes of the inductor L11 and the inductor L23, an effect of weakening magnetic field coupling in comparison with the case where the directions of winding axes are parallel to each other is achieved.

Although FIGS. 5 and 6 illustrate the case where both the directions of the winding axes of the inductor L11 and the inductor L23 are parallel to the X-axis direction in these figures, when the inductor L11 and the inductor L23 are disposed such that the winding axes thereof are not parallel to each other, magnetic field coupling between the inductor L11 and the inductor L23 can be further weakened.

Furthermore, although FIGS. 5 and 6 illustrate, as an example, the case where an inductor included in each filter is a chip component mounted on a substrate surface, a portion or the whole of the inductor may be formed with a wiring pattern in the substrate. In this case as well, when a positional relationship among elements when the substrate is viewed in plan achieves the above-described configuration, a similar effect can be achieved.

In the above description, as an example, the case has been given where, in pass bands of three filters, a pass band of a high band-side filter and a pass band of a middle band-side filter are adjacent to each other. In this case, the high band-side filter FLT1 corresponds to "first filter" according to the present disclosure, the middle band-side filter FLT2 corresponds to "second filter" according to the present disclosure, and the low band-side filter FLT3 corresponds to "third filter" according to the present disclosure.

On the other hand, in the case as well where the pass band of the middle band-side filter and a pass band of a low band-side filter are adjacent to each other, when a similar configuration is employed, isolation characteristics between the middle band-side filter and the low band-side filter can be improved. In other words, in this case, a layout is provided such that, when the substrate is viewed in plan, at least a portion of a component of the high band-side filter is included between an inductor that forms a low-frequency-side attenuation pole of the middle band-side filter and an inductor that forms a high-frequency-side attenuation pole of the low band-side filter (that is, within a region with an outer edge partially constituted by two inductors). This weakens magnetic field coupling between the inductor of the middle band-side filter and the inductor of the low band-side filter, enabling an improvement in isolation characteristics between the middle band-side filter and the low band-side filter. Incidentally, in this case, the middle band-side filter corresponds to "first filter" according to the present disclosure, the low band-side filter corresponds to "second filter" according to the present disclosure, and the high band-side filter corresponds to "third filter" according to the present disclosure.

(Modification 1)

In the above-described embodiment, although the case has been described as an example where each filter is an LC filter constituted by an inductor and a capacitor, for at least one of capacitors, an acoustic wave device, such as a SAW (Surface Acoustic Wave) resonator or BAW (Bulk Acoustic Wave) resonator, may be formed. Such an acoustic wave device has a capacitance component and thus can be used in place of a capacitor.

Figure 7:
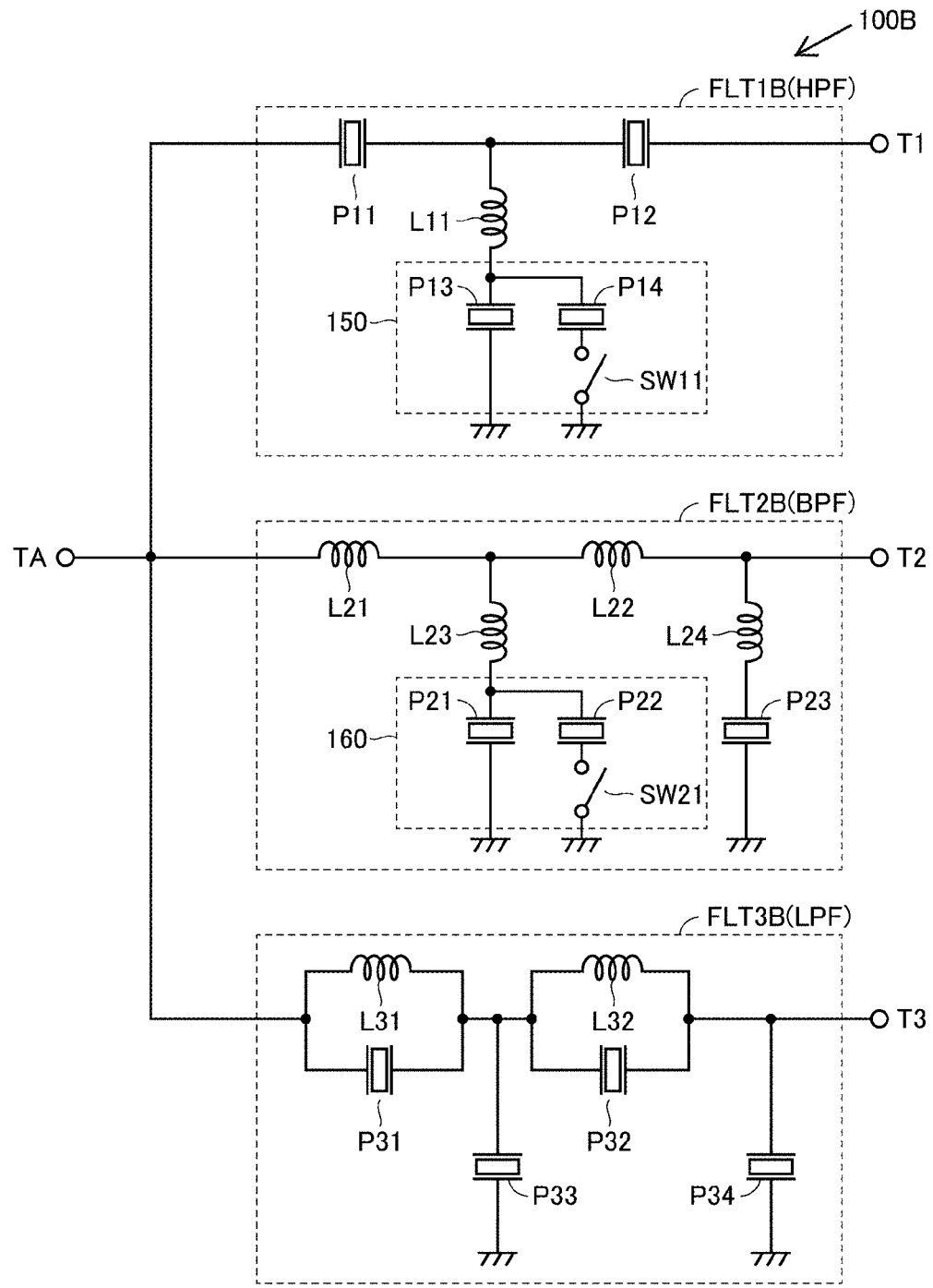
FIG. 7 illustrates a circuit configuration of a multiplexer according to Modification 1.

FIG. 7 illustrates a circuit configuration of a multiplexer 100B according to Modification 1. In the multiplexer 100B illustrated in FIG. 7, a configuration is provided in which the filters FLT1 to FLT3 of the multiplexer 100 described with reference to FIG. 2 are respectively replaced with filters FLT1B to FLT3B.

More specifically, with respect to the filter FLT1B, a configuration is provided in which the capacitors C11 to C14 in the filter FLT1 illustrated in FIG. 2 are replaced with acoustic wave resonators P11 to P14. Similarly, with respect to the filter FLT2B, the capacitors C21 to C23 in the filter FLT2 are replaced with acoustic wave resonators P21 to P23. With respect to the filter FLT3B, the capacitors C31 to C34 in the filter FLT3 are replaced with acoustic wave resonators P31 to P34.

With respect to the multiplexer 100B having such a configuration, in two filters that pass signals in respective frequency bands adjacent to each other, between inductors that form attenuation poles (that is, within a region with an outer edge partially constituted by two inductors), at least a portion of a component of another filter is disposed, and thus magnetic field coupling between the inductors can be weakened, thereby enabling an improvement in isolation characteristics between the two filters.

(Modification 2)

In the embodiment and Modification 1, although the case of a so-called triplexer, which is a multiplexer constituted by three filters, has been described, a technical idea of the present disclosure is also applicable to the case of a multiplexer including four or more filters. Even in the case where four or more filters are provided, for two filters that pass signals in respective frequency bands adjacent to each other, between inductors that form attenuation poles on adjacent sides of the frequency bands (that is, within a region with an outer edge partially constituted by two inductors), at least a portion of a filter other than the two filters is disposed, thereby enabling an improvement in isolation characteristics between the two filters.

Figure 8:
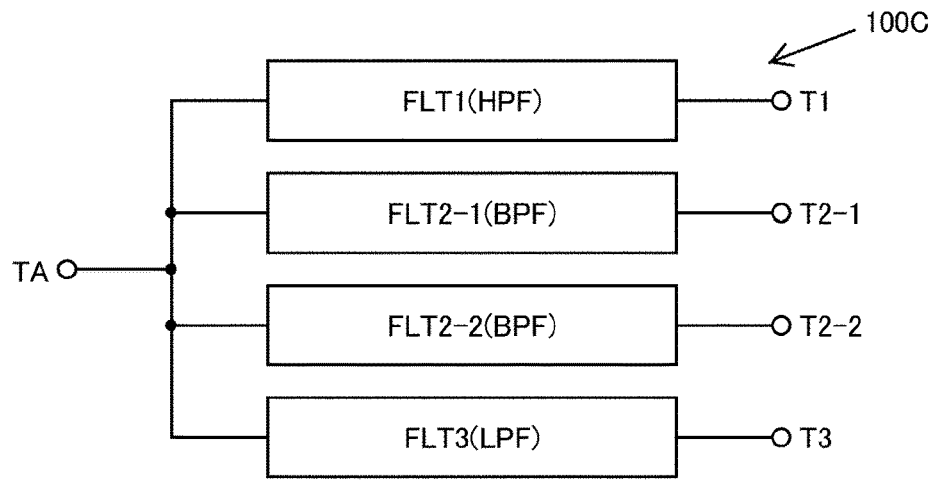
FIG. 8 illustrates an example of a multiplexer including four filters.

FIG. 8 is a schematic diagram of a multiplexer 100C including four filters. The multiplexer 100C includes the filter FLT1, which is a high pass filter connected between the antenna terminal TA and the terminal T1, a filter FLT2-1, which is a band pass filter connected between the antenna terminal TA and a terminal T2-1, a filter FLT2-2, which is a band pass filter connected between the antenna terminal TA and a terminal T2-2, and the filter FLT3, which is a low pass filter connected between the antenna terminal TA and the terminal T3. Incidentally, as described in the embodiment, the high pass filter of the filter FLT1 and the low pass filter of the filter FLT3 may be changed to a band pass filter.

Frequency bands of signals passed by the four filters correspond to four frequency bands among five frequency bands of greater than or equal to 1427 MHz and less than 2690 MHz, greater than or equal to 3300 MHz and less than 4200 MHz, greater than or equal to 4400 MHz and less than 5000 MHz, greater than or equal to 5150 MHz and less than 6000 MHz, and greater than or equal to 5925 MHz and less than 7125 MHz. For example, with respect to frequency bands of signals passed by the respective filters, the filter FLT1 has a frequency band of greater than or equal to 5150 MHz and less than 6000 MHz, the filter FLT2-1 has a frequency band of greater than or equal to 4400 MHz and less than 5000 MHz, the filter FLT2-2 has a frequency band of greater than or equal to 3300 MHz and less than 4200 MHz, and the filter FLT3 has a frequency band of greater than or equal to 1427 MHz and less than 2690 MHz.

With respect to any three of these four filters, when the substrate where the multiplexer 100C is formed is viewed in plan, for two filters that pass signals in respective frequency bands adjacent to each other, between inductors that form attenuation poles on adjacent sides of the frequency bands (that is, within a region with an outer edge partially constituted by two inductors), at least a portion of a component of a filter other than the two filters is disposed, thereby enabling an improvement in isolation characteristics between these two filters.

Figure 9:
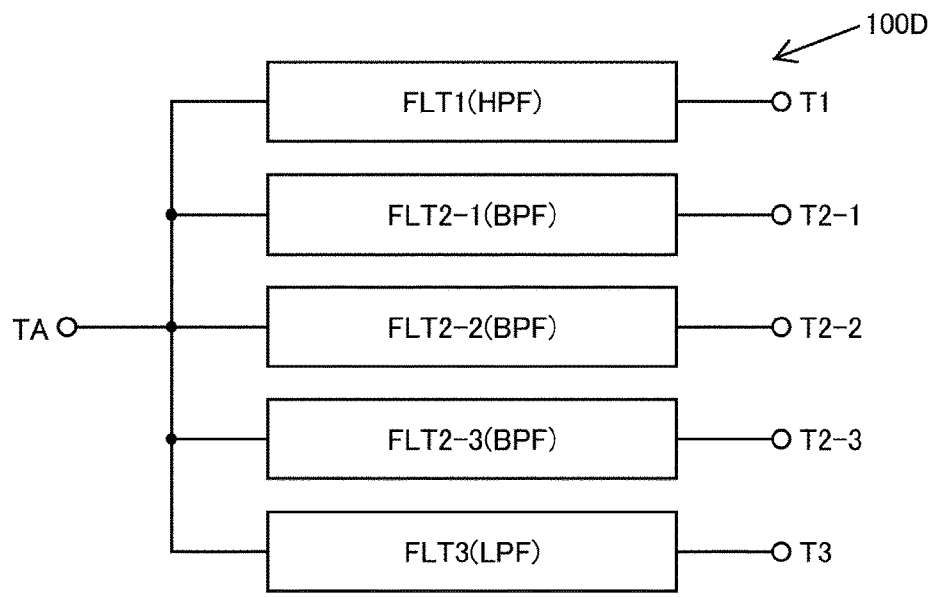
FIG. 9 illustrates an example of a multiplexer including five filters.

Furthermore, FIG. 9 is a schematic diagram of a multiplexer 100D including five filters. The multiplexer 100D further includes a filter FLT2-3 in addition to the configuration of the multiplexer 100C illustrated in FIG. 8.

The filter FLT2-3 is a band pass filter connected between the antenna terminal TA and a terminal T2-3 and has, as a pass band, a frequency band between a pass band of the filter FLT2-2 and a pass band of the filter FLT3.

Frequency bands of signals passed by the respective filters of the multiplexer 100D correspond to five frequency bands among six frequency bands of greater than or equal to 699 MHz and less than 960 MHz, greater than or equal to 1427 MHz and less than 2200 MHz, greater than or equal to 2300 MHz and less than 2690 MHz, greater than or equal to 3300 MHz and less than 5000 MHz, greater than or equal to 5150 MHz and less than 6000 MHz, and greater than or equal to 5925 MHz and less than 7125 MHz. For example, with respect to frequency bands of signals passed by the respective filters, the filter FLT1 has a frequency band of greater than or equal to 5150 MHz and less than 6000 MHz, the filter FLT2-1 has a frequency band of greater than or equal to 3000 MHz and less than 5000 MHz, the filter FLT2-2 has a frequency band of greater than or equal to 2300 MHz and less than 2690 MHz, the filter FLT2-3 has a frequency band of greater than or equal to 1427 MHz and less than 2200 MHz, and the filter FLT3 has a frequency band of greater than or equal to 699 MHz and less than 960 MHz.

When the substrate where the multiplexer 100D is formed is viewed in plan, of these five filters, for two filters that pass signals in respective frequency bands adjacent to each other, between inductors that form attenuation poles on adjacent sides of the frequency bands (that is, within a region with an outer edge partially constituted by two inductors), at least a portion of a component of a filter other than the two filters is disposed, thereby enabling an improvement in isolation characteristics between the two adjacent filters.

Incidentally, in FIGS. 8 and 9, any format can be employed for a specific configuration of each filter.

Furthermore, features of the present disclosure are also applicable to a multiplexer that performs separation into signals in seven or more frequency bands.

(Modification 3)

Although, in the above-described multiplexers illustrated in FIGS. 5 and 6, the configuration has been described in which the inductors and the switch circuit formed as chip components are disposed on one side of the substrate, a configuration may be used in which these components are disposed on both sides of the substrate.

For example, even in the case where elements related to the high-band filter FLT1 and the low-band filter FLT3 are disposed on a front side (first side) of the substrate 105 and elements related to the middle-band filter FLT2 are disposed on a backside (second side) of the substrate 105, when the substrate 105 is viewed in plan, as long as at least a portion of a component (for example, inductor L32) included in the filter FLT3 is disposed between the inductor L11 and the inductor L23 that form adjacent attenuation poles, isolation characteristics between the filter FLT1 and the filter FLT2 can be kept from deteriorating.

Furthermore, in a configuration in which inductors related to the filters FLT1 and FLT2 are disposed on the both sides of the substrate 105, a component included in the filter FLT3 may be formed in or on an internal layer of the substrate 105. In this case as well, as seen in a multiplexer 100E illustrated in FIG. 10, when a component (for example, inductor L32A) included in the filter FLT3 is disposed between the inductor L11 of the filter FLT1 disposed on the front side of the substrate 105 and the inductor L23 included in the filter FLT2 disposed on the backside of the substrate 105 (within a region AR2 in FIG. 10), isolation characteristics between the filter FLT1 and the filter FLT2 can be kept from deteriorating.

Incidentally, as in a 100F illustrated in FIG. 11, in a configuration in which the inductor L23 of the filter FLT2 is disposed directly below the inductor L11 of the filter FLT1, that is, in a configuration as well in which the inductor L11 and the inductor L23 overlap each other when viewed in plan from a direction of a normal to the substrate 105, when a component (for example, inductor L32B) included in the filter FLT3 is disposed between the inductor L11 and the inductor L23, isolation characteristics between the filter FLT1 and the filter FLT2 can be kept from deteriorating.

Figure 10:
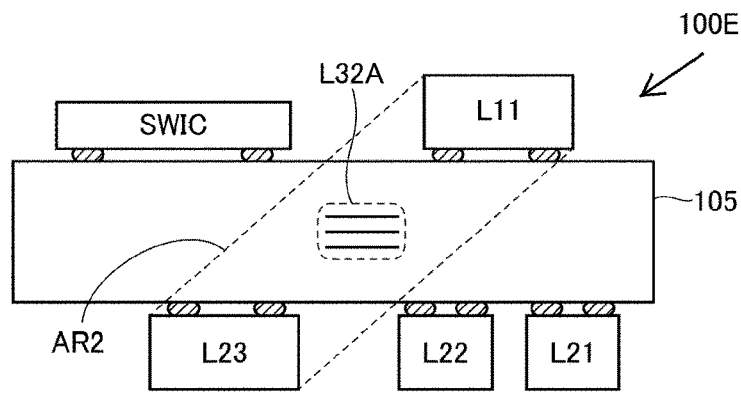
FIG. 10 illustrates a first example of a component layout of a multiplexer in Modification 3.
Figure 11:
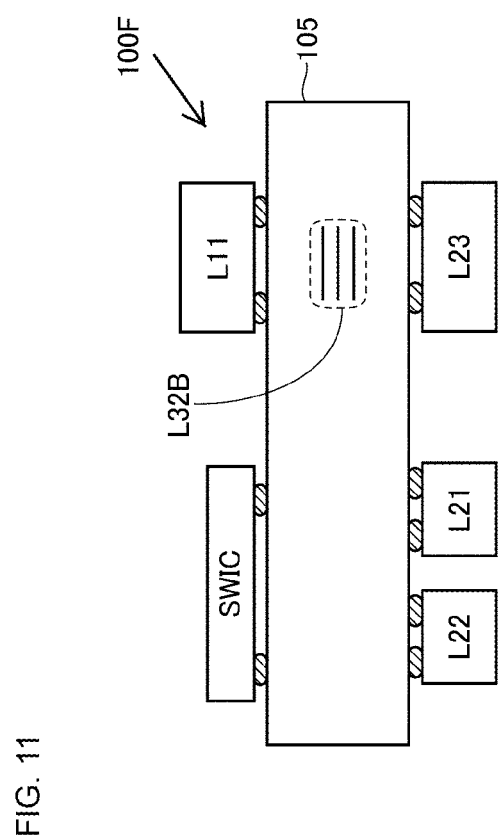
FIG. 11 illustrates a second example of a component layout of a multiplexer in Modification 3.

Incidentally, in FIGS. 10 and 11, each of the inductors L32A and L32B is formed, for example, as a helical coil formed through a plurality of layers and having a winding axis parallel to a stacking direction of the substrate 105. Alternatively, a meander coil formed with a wiring pattern and a via may be used, or a helical coil having a winding axis parallel to a direction orthogonal to the stacking direction of the substrate 105 may be used.

Furthermore, in examples of FIGS. 10 and 11, in the case where the inductor L11 of the filter FLT1 and the inductor L23 of the filter FLT2 are formed not on the both sides of the substrate 105, but in or on different internal layers of the substrate 105, a configuration may be used in which a component included in the filter FLT3 is disposed between the inductor L11 and the inductor L23.

It should be noted that the embodiments disclosed here are illustrative only and not restrictive in any respect. The scope of the present disclosure is defined not by the above description of the embodiment, but by the claims, and is intended to include all changes made within the meaning and scope equivalent to the claims.

10 communication device, 20 radio frequency front-end circuit, 30 RFIC, 100, 100A to 100F multiplexer, 105 substrate, 111 to 113, 131 to 133, SW11, SW21 switch, 121 to 128 band pass filter, 141 to 143 amplifier circuit, 150, 160 variable impedance circuit, ANT antenna device, C11 to C14, C21 to C23, C31 to C34 capacitor, FLT1, FLT1B, FLT2, FLT2-1 to 2-3, FLT2B, FLT3, FLT3B filter, L11, L21 to L24, L31, L32, L32A, L32B, inductor, P11 to P14, P21 to P23, P31 to P34 acoustic wave resonator, SWIC switch circuit, T1 to T3, T2-1 to T2-3 terminal, TA antenna terminal.

The invention claimed is:

1. A multiplexer configured to pass signals in a plurality of frequency bands, the multiplexer comprising:
   a first filter configured to pass a first signal in a first frequency band;
   a second filter configured to pass a second signal in a second frequency band lower than the first frequency band; and
   a third filter configured to pass a third signal in a third frequency band,
   wherein the third frequency band is higher than the first frequency band or lower than the second frequency band,
   wherein the first filter includes a first inductor configured to form a first attenuation pole on a low-frequency side of the first frequency band,
   wherein the second filter includes a second inductor configured to form a second attenuation pole on a high-frequency side of the second frequency band, and
   wherein at least a portion of a component constituting the third filter is disposed between the first inductor and the second inductor.

2. The multiplexer according to claim 1, further comprising a substrate where the first to third filters are formed, wherein when the substrate is viewed in plan, the at least the portion of the component constituting the third filter is disposed between the first inductor and the second inductor.

3. The multiplexer according to claim 2, wherein the first inductor and the second inductor are mounted on the substrate.

4. The multiplexer according to claim 2,
   wherein the third filter includes a third inductor with at least a portion disposed between the first inductor and the second inductor, and
   wherein the third inductor is disposed such that a winding axis of the third inductor is not parallel to a winding axis of the first inductor and a winding axis of the second inductor.

5. The multiplexer according to claim 2, wherein the first inductor and the second inductor are disposed such that their respective winding axes are not parallel to each other.

6. The multiplexer according to claim 2,
   wherein each of the first, second, and third frequency bands corresponds to a different one of the following:
   a frequency band of 1427 MHz to 2690 MHz,
   a frequency band of 3300 MHz to 4200 MHz,
   a frequency band of 4400 MHz to 5000 MHz,
   a frequency band of 5150 MHz to 6000 MHz, and
   a frequency band of 5925 MHz to 7125 MHz.

7. The multiplexer according to claim 2,
   wherein each of the first, second, and third frequency bands corresponds to a different one of the following:
   a frequency band of 699 MHz to 960 MHz,
   a frequency band of 1427 MHz to 2200 MHz,
   a frequency band of 2300 MHz to 2690 MHz,
   a frequency band of 3300 MHz to 5000 MHz,
   a frequency band of 5150 MHz to 6000 MHz, and
   a frequency band of 5925 MHz to 7125 MHz.

8. A radio frequency front-end circuit comprising:
   the multiplexer according to claim 2; and
   an amplifier circuit connected to the multiplexer.

9. A communication device comprising:
   the radio frequency front-end circuit according to claim 8; and
   an RF signal processing circuit connected to the radio frequency front-end circuit.

10. The multiplexer according to claim 1,
    wherein the first attenuation pole is an attenuation pole closest to the first frequency band of a plurality of first attenuation poles formed on the low-frequency side of the first frequency band, and
    wherein the second attenuation pole is an attenuation pole closest to the second frequency band of a plurality of second attenuation poles formed on the high-frequency side of the second frequency band.

11. The multiplexer according to claim 10,
    wherein the first filter includes:
      a first series arm circuit formed between an antenna terminal and a first terminal, and
      a first parallel arm circuit connected between the first series arm circuit and a ground potential, the first parallel arm circuit including the first inductor,
    wherein the second filter includes:
      a second series arm circuit formed between the antenna terminal and a second terminal, and
      a second parallel arm circuit connected between the second series arm circuit and the ground potential, the second parallel arm circuit including the second inductor,
    wherein the first parallel arm circuit includes a first variable impedance circuit connected in series with the first inductor between the first series arm circuit and the ground potential,
    wherein the second parallel arm circuit includes a second variable impedance circuit connected in series with the second inductor between the second series arm circuit and the ground potential, and
    wherein the first parallel arm circuit and the second parallel arm circuit are configured to change respective frequencies of the first attenuation pole and the second attenuation pole by switching respective impedances of the first variable impedance circuit and the second variable impedance circuit.

12. The multiplexer according to claim 11,
    wherein the first variable impedance circuit and the second variable impedance circuit include a first switch and a second switch, respectively, for switching an impedance, and
    wherein the first switch and the second switch are formed in a same element.

13. The multiplexer according to claim 10, wherein the first inductor and the second inductor are mounted on a substrate.

14. The multiplexer according to claim 1, wherein the first inductor and the second inductor are mounted on a substrate.

15. The multiplexer according to claim 1,
    wherein the third filter includes a third inductor with at least a portion disposed between the first inductor and the second inductor, and
    wherein the third inductor is disposed such that a winding axis of the third inductor is not parallel to a winding axis of the first inductor and a winding axis of the second inductor.

16. The multiplexer according to claim 1, wherein the first inductor and the second inductor are disposed such that their respective winding axes are not parallel to each other.

17. The multiplexer according to claim 1,
    wherein each of the first, second and third frequency bands corresponds to a different one of the following:
    a frequency band of 1427 MHz to 2690 MHz,
    a frequency band of 3300 MHz to 4200 MHz,
    a frequency band of 4400 MHz to 5000 MHz,
    a frequency band of 5150 MHz to 6000 MHz, and
    a frequency band of 5925 MHz to 7125 MHz.

18. The multiplexer according to claim 1,
wherein each of the first, second, and third frequency bands corresponds to a different one of the following:
a frequency band of 699 MHz to 960 MHz,
a frequency band of 1427 MHz to 2200 MHz,
a frequency band of 2300 MHz to 2690 MHz,
a frequency band of 3300 MHz to 5000 MHz,
a frequency band of 5150 MHz to 6000 MHz, and
a frequency band of 5925 MHz to 7125 MHz.

19. A radio frequency front-end circuit comprising:
the multiplexer according to claim 1; and
an amplifier circuit connected to the multiplexer.

20. A communication device comprising:
the radio frequency front-end circuit according to claim 19; and
an RF signal processing circuit connected to the radio frequency front-end circuit.

\* \* \* \* \*